United States Patent
Yoon et al.

(10) Patent No.: US 7,241,552 B2
(45) Date of Patent: Jul. 10, 2007

(54) RESIST COMPOSITION COMPRISING PHOTOSENSITIVE POLYMER HAVING LACTONE IN ITS BACKBONE

(75) Inventors: Kwang-sub Yoon, Seoul (KR); Dong-won Jung, Yongin (KR); Si-hyeung Lee, Suwon (KR); Hyun-woo Kim, Sungnam (KR); Sook Lee, Seoul (KR); Sang-gyun Woo, Suwon (KR); Sang-jun Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/909,384

(22) Filed: Aug. 3, 2004

(65) Prior Publication Data

US 2005/0008975 A1 Jan. 13, 2005

Related U.S. Application Data

(60) Continuation of application No. 10/349,917, filed on Jan. 24, 2003, now Pat. No. 7,045,267, which is a division of application No. 09/901,569, filed on Jul. 11, 2001, now Pat. No. 6,537,727.

(30) Foreign Application Priority Data

Jul. 11, 2000 (KR) ............................. 2000-39562
Dec. 12, 2000 (KR) ............................. 2000-75485

(51) Int. Cl.
G03F 7/004 (2006.01)
(52) U.S. Cl. ............... 430/270.1; 430/905; 522/168; 522/181; 522/182
(58) Field of Classification Search ............ 430/270.1, 430/905; 522/168, 181, 182
See application file for complete search history.

(56) References Cited

U.S. PATENT DOCUMENTS

| | | | |
|---|---|---|---|
| 5,814,432 A | 9/1998 | Kobayashi | |
| 5,843,624 A | 12/1998 | Houlihan et al. | |
| 6,018,559 A | 2/2000 | Brandenburg et al. | |
| 6,280,897 B1 | 8/2001 | Asakawa et al. | |
| 6,303,266 B1 * | 10/2001 | Okino et al. | 430/270.1 |
| 6,313,318 B1 | 11/2001 | Coulson et al. | |
| 6,461,791 B1 | 10/2002 | Hatakeyama et al. | |
| 6,537,727 B2 * | 3/2003 | Yoon et al. | 430/270.1 |
| 6,642,346 B2 | 11/2003 | Brandenburg et al. | |
| 6,835,525 B2 * | 12/2004 | Nishi et al. | 430/270.1 |
| 6,849,376 B2 * | 2/2005 | Barclay et al. | 430/270.1 |
| 2002/0028881 A1 | 3/2002 | Brandenburg et al. | |
| 2002/0150835 A1 * | 10/2002 | Nishi et al. | 430/270.1 |
| 2002/0155379 A1 | 10/2002 | Yoon et al. | |
| 2003/0031949 A1 | 2/2003 | Barclay et al. | |
| 2003/0130414 A1 | 7/2003 | Brandenburg et al. | |
| 2005/0079438 A1 * | 4/2005 | Cao et al. | 430/270.1 |

FOREIGN PATENT DOCUMENTS

| | | | |
|---|---|---|---|
| JP | 09033736 | | 2/1997 |
| JP | 09033736 A | * | 2/1997 |
| JP | 2000-26446 | | 1/2000 |

OTHER PUBLICATIONS

English language machine translation of JP 09-033736.*
Akiko Kotachi et al., "A Novel Polymer for a 193-nm Resist," Journal of Photopolymer Science and Technology, vol. No. 3 (1996) pp. 509-522.
Mikio Yamachika et al., "Improvement of Post-Exposure Dealy Stability in Alicyclic ArF Excimer Photoresists," Journal of Photopolymer Science and Technology, vol. 12, Number 4 (1999) pp. 553-559.
Naomi Shida et al., "advanced Materisla for 193-nm Resists," Journal of Photopolymer Science and Technology, vol. 13, No. 4 (2000) pp. 691-696.
Poskonin et al., "Studies on Substituted Butane and Butenollides, XIII, Synthesis of Copolymers of 4-Acetoxy-2-Butenolide and Vinyl Compounds," Russion Journal of Organic Chemistry, vol. 33, No. 4, 1997, pp. 520-523, translated by Zhurnal Organischeskoi.
Poskonin et al., "Studies on Substituted Butane and Butenoilides, XIV, Synthesis of High Molecular Butanolides on the Basis of 4-Alkoxy-2-butenolides and Vinyl Monomers," Russion Journal of Organic Chemistry, vol. 35, No. 5, 1999, pp. 721-726, translated by Zhurnal Organischeskoi.

* cited by examiner

Primary Examiner—Amanda Walke
(74) Attorney, Agent, or Firm—Volentine & Whitt, PLLC

(57) ABSTRACT

A resist composition includes a photoacid generator (PAG) and a photosensitive polymer. The photosensitive polymer is polymerized with (a) at least one of the monomers having the respective formulae:

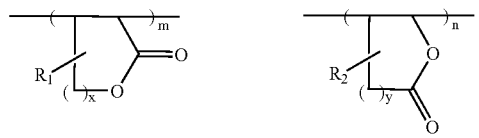

where R1 and R2 are independently a hydrogen atom, alkyl, hydroxyalkyl, alkyloxy, carbonyl or ester, and x and y are independently integers from 1 to 6, and (b) at least one of a (meth)acrylate monomer, a maleic anhydride monomer, and a norbornene monomer.

8 Claims, No Drawings

RESIST COMPOSITION COMPRISING PHOTOSENSITIVE POLYMER HAVING LACTONE IN ITS BACKBONE

CROSS-REFERENCE TO RELATED APPLICATION(S)

This is a continuation of U.S. patent application Ser. No. 10/349,917, filed Jan. 24, 2003 now U.S. Pat. No. 7,045,267, which is a divisional of U.S. patent application Ser. No. 09/901,569, filed Jul. 11, 2001, and now U.S. Pat. No. 6,537,727. A claim of priority is made to both said applications, and the entire contents of both said applications are incorporated herein by reference.

BACKGROUND OF THE INVENTION

1. Field of the Invention

The present invention generally relates to a chemically amplified resist composition, and more particularly, the present invention relates to a resist composition comprising a photosensitive polymer having lactone in its backbone.

2. Description of the Related Art

As the integration density and complexity of semiconductor devices continue to increase, the ability to form ultra-fine patterns becomes more and more critical. For example, in 1-Gigabit or higher semiconductor devices, a pattern size having a design rule of 0.2 μm or less is needed. For this reason, in lithography processes, the lower wavelength ArF eximer laser (193 nm) has emerged as a preferred exposure light source to the more conventional and higher wavelength KrF eximer laser (248 nm).

However, compared with conventional (KrF) resist materials, resist materials which are suitable for use with the ArF eximer laser suffer from a variety drawbacks. The most serious problems relate transmittance and resistance to dry etching.

Almost all well-known ArF resist compositions contain (meth)acryl-based polymers. Among these polymers, a methacrylate copolymer having an alicyclic protecting group, which is expressed by the formula below, has been suggested (*J. Photopolym. Sci. Technol.*, 9(3), pp. 509 (1996))

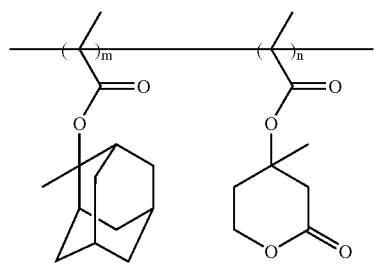

This polymer has an adamantyl group, which contributes to enhancing resistance to dry etching, and a lactone group, which improves adhesiveness, in its methacrylate backbone. As a result, the resolution of the resist and the depth of focus are improved. However, resistance to dry etching is still weak, and serious line edge roughness is observed after line patterns are formed from the resist layer.

Another drawback of the aforementioned polymer is that the raw material used to synthesize the polymer is expensive. In particular, the manufacturing cost of a polymer having a lactone group, which is introduced to improve adhesiveness, is so high that its practical use as a resist is difficult.

As another conventional resist composition, a cycloolefin-maleic anhydride (COMA) alternating polymer having the following formula has been suggested (*J. Photopolym. Sci. Technol.*, Vol. 12(4), pp. 553 (1999), and U.S. Pat. No. 5,843,624)

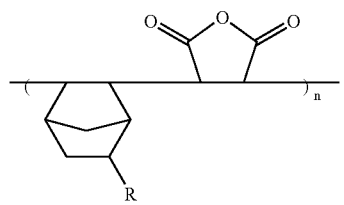

In the production of a copolymer, such as a COMA alternating polymer having the formula above, the production cost of raw material is relatively inexpensive, but the yield of the polymer sharply decreases. In addition, the transmittance of the polymer is very low at a short wavelength region, for example at 193 nm. The synthetic polymers have in their backbone the alicyclic group, which exhibits prominent hydrophobicity, and thus the adhesiveness to neighboring material layers is very poor.

The copolymer has a glass transition temperature of 200° C. or more due to the structural characteristic of the backbone. As a result, it is difficult to carry out an annealing process for eliminating free volume from the resist layer formed of the polymer, and accordingly the resist layer is influenced by ambient conditions which can cause, for example, a T-top profile of corresponding resist patterns. In addition, the resist layer itself becomes less resistant to ambient conditions during post-exposure delay, so that many problems can occur during subsequent processes with respect to the photoresist layer.

To improve the resolution of the resist layer, the polymer system must be charged with a polar group. In recent years, a technique of introducing a lactone group into a methacrylate monomer having an alicyclic protecting group, using the following alicyclic compounds with a lactone group, has been suggested so as to enhance the resistance to dry etching (*J. Photopolym. Sci. Technol.*, Vol. 13(4), pp. 601 (2000), and Japanese Patent Laid-open No. hei 12-26446):

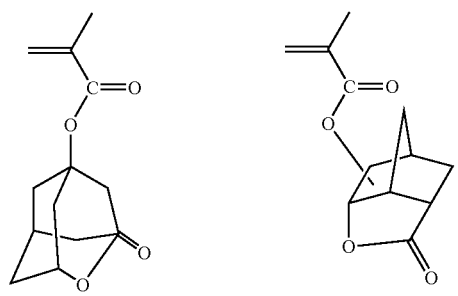

Unfortunately, the yield of the monomer having the above formula is so low as to substantially increase manufacturing costs.

SUMMARY OF THE INVENTION

It is an objective of the present invention to provide a resist composition that can be produced at relatively low costs while exhibiting improved dry etching resistance, improved adhesiveness to underlying material layers, improved line edge roughness of line patterns, and improved contrast characteristics.

To achieve the objective of the present invention, there is provided a resist composition comprising a photosensitive polymer polymerized with (a) at least one of the monomers having the respective formulae:

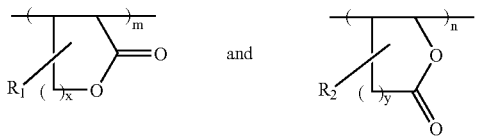

where $R_1$ and $R_2$ are independently a hydrogen atom, alkyl, hydroxyalkyl, alkyloxy, carbonyl or ester, and x and y are independently integers from 1 to 6, and (b) at least one comonomer selected from the group consisting of (meth)acrylate monomer, maleic anhydride monomer, and norbornene monomer; and a photoacid generator (PAG).

In one embodiment of the resist composition, the comonomer may be (meth)acrylate monomer, and the formula of the photosensitive polymer may be one selected from the formulae:

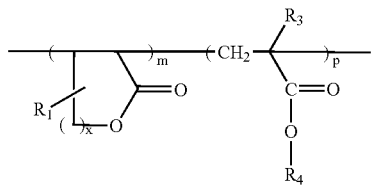

where R3 is a hydrogen atom or methyl, R4 is an acid-liable group, m/(m+p) is in the range of 0.01-0.5,

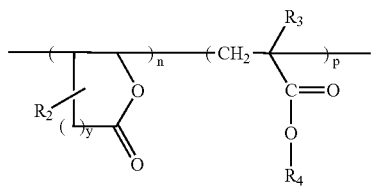

where R3 is a hydrogen atom or methyl, R4 is an acid-liable group, n/(n+p) is in the range of 0.01-0.5, and

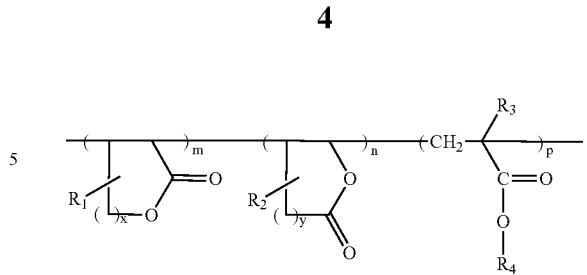

where R3 is a hydrogen atom or methyl, R4 is an acid-liable group, (m+n)/(m+n+p) is in the range of 0.01-0.5.

In one embodiment of the resist composition, the comonomer may be norbornene monomer, and the formula of the photosensitive polymer may be one selected from the formulae:

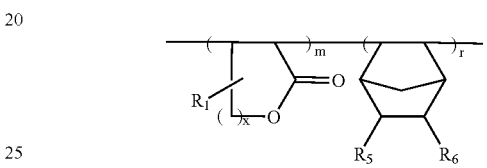

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; m/(m+r) is in the range of 0.01-0.5,

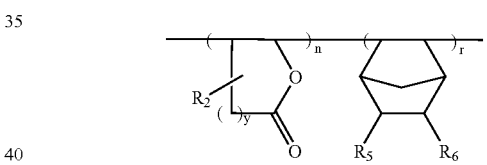

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; n/(n+r) is in the range of 0.01-0.5, and

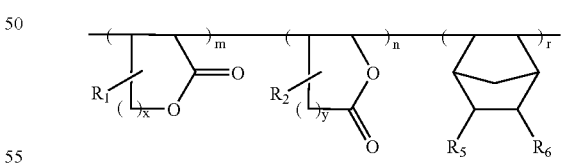

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; (m+n)/(m+n+r) is in the range of 0.01-0.5.

In one embodiment of the resist composition, the comonomers may be (meth)acrylate and norbornene monomer, and the formula of the photosensitive polymer may be one selected from the formulae:

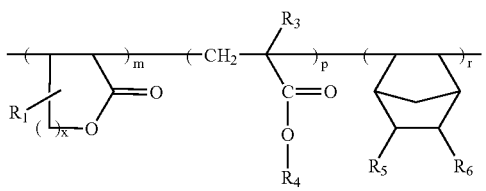

where R3 is a hydrogen atom or methyl; R4 is an acid-liable group; R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $m/(m+p+r)$ is in the range of 0.01-0.5; $p/(m+p+r)$ is in the range of 0.1-0.6; and $r(m+p+r)$ is in the range of 0.1-0.6,

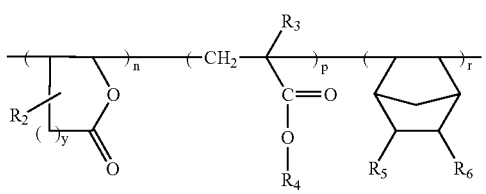

where R3 is a hydrogen atom or methyl; R4 is an acid-liable group; R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $n/(n+p+r)$ is in the range of 0.01-0.5; $p/(n+p+r)$ is in the range of 0.1-0.6; and $r(n+p+r)$ is in the range of 0.1-0.6, and

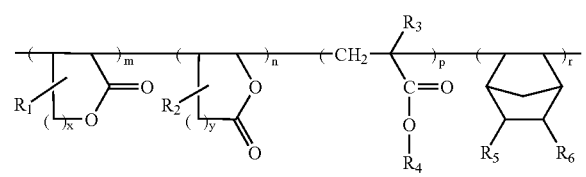

where R3 is a hydrogen atom or methyl; R4 is an acid-liable group; R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $p/(m+n+p+r)$ is in the range of 0.1-06; and $q(m+n+p+r)$ is in the range of 0.1-0.6.

In one embodiment of the resist composition, the comonomers may be maleic anhydride monomor and norbornene monomer, and the formula of the photosensitive polymer may be one selected from the formulae:

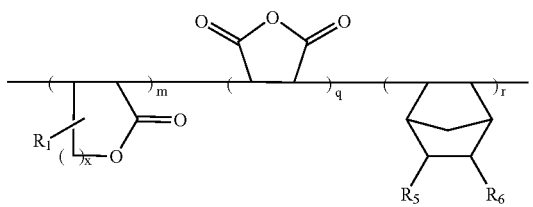

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $m/(m+q+r)$ is in the range of 0.01-0.5, $q/(m+q+r)$ is in the range of 0.1-0.6, and $r(m+q+r)$ is in the range of 0.1-0.6,

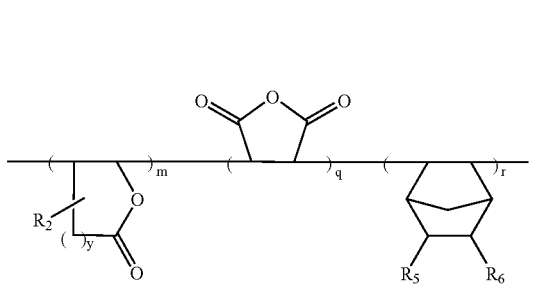

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $n/(n+q+r)$ is in the range of 0.01-0.5, $q/(n+q+r)$ is in the range of 0.1-0.6, and $r(n+q+r)$ is in the range of 0.1-0.6, and

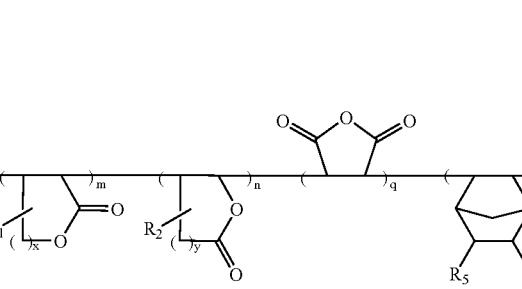

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $(m+n)/(m+n+q+r)$ is in the range of 0.01-0.5, $q/(m+n+q+r)$ is in the range of 0.1-06, and $r(m+n+q+r)$ is in the range of 0.1-0.6.

DETAILED DESCRIPTION OF THE PREFERRED EMBODIMENTS

SYNTHESIS EXAMPLE 1

Synthesis of Terpolymer

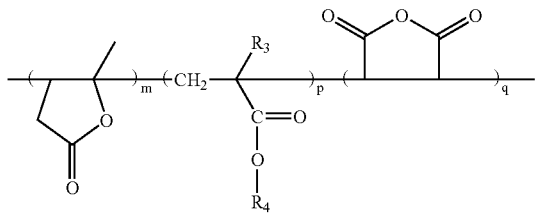

Synthesis Example 1-1

($R_3$=methyl, $R_4$=2-methyl-adamantyl)

12.0 g 2-methyladamantylmethacrylate (MAdMA), 3.4 g maleic anhydride (MA), and 1.66 g α-angelicalactone (AGL) were dissolved in 17 g tetrahydrofuran (THF). 1.38 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the terpolymer having the formula above was obtained with a yield of 72%.

The obtained terpolymer had a weight average molecular weight (Mw) of 11,400, and a polydispersity (Mw/Mn) of 2.4.

In the synthesis of the terpolymer, the mixing ratio of the monomers can be varied to adjust the solubility of the polymer. The various mixing ratios of the monomers and the characteristics of the resultant five terpolymers are listed below in Table 1.

twice, filtered, and dried in a vacuum oven for 24 hours, so that the terpolymer having the formula above was obtained with a yield of 65%.

The obtained terpolymer had a weight average molecular weight (Mw) of 12,100, and a polydispersity (Mw/Mn) of 2.6.

Synthesis Example 1-3

($R_3$=methyl, $R_4$=1-methylcyclohexyl)

5.5 g 1-methylcyclohexylmethacrylate (MChMA), 1.7 g maleic anhydride (MA), and 0.83 g α-angelicalactone (AGL) were dissolved in 8 g tetrahydrofuran (THF). 0.69 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the terpolymer having the formula above was obtained with a yield of 71%.

The obtained terpolymer had a weight average molecular weight (Mw) of 11,000, and a polydispersity (Mw/Mn) of 2.6.

SYNTHESIS EXAMPLE 2

Synthesis of Tetrapolymer

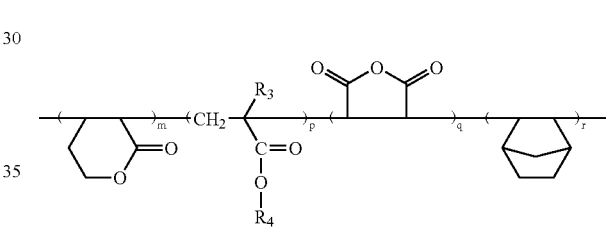

In the above formula, $R_3$ is methyl and $R_4$ is 2-methyl-adamantyl.

TABLE 1

| Mixing Ratio of Monomers (MAdMa:MA:AGL) | Concentration of Initiator (mol %) | Solvent-to-Monomer ratio (by weight) | Polymerization Time (hr) | Yield (%) | Mw | Mw/Mn |
|---|---|---|---|---|---|---|
| 3:4:1 | AIBN 0.05 | 0.5 | 24 | 68 | 32,100 | 3.3 |
| 3:3:1 | AIBN 0.05 | 0.5 | 24 | 87 | 21,000 | 2.2 |
| 3:2:1 | AIBN 0.05 | 0.5 | 24 | 80 | 17,300 | 2.7 |
| 3:1:2 | V601 0.05 | 1 | 20 | 56 | 7,200 | 1.7 |
| 3:2:1 | V601 0.05 | 1 | 20 | 73 | 9,800 | 2.8 |

Synthesis Example 1-2

($R_3$=methyl, $R_4$=8-ethyl-8-tricyclo[5.2.1.0$^{2,6}$]decanyl)

14.8 g 8-ethyl-8-tricyclo[5.2.1.0$^{2,6}$]decanylmethacrylate (ETCDMA), 3.4 g maleic anhydride (MA), and 1.66 g α-angelicalactone (AGL) were dissolved in 20 g tetrahydrofuran (THF). 1.38 g dimethyl 2,2'-azobisisobutyrate (V601) was added into the solution, degassed and polymerized at 70° C. for 20 hours.

After the reaction was completed, the obtained reaction product was precipitated with excess isopropyl alcohol 6 g 2-methyladamantylmethacrylate (MAdMA), 1.9 g maleic anhydride (MA), 1.0 g 5,6-dihydro-2H-pyrane-2-one (DHPone) and 0.63 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 71%.

The obtained tetrapolymer had a weight average molecular weight (Mw) of 12,000, and a polydispersity (Mw/Mn) of 2.1.

SYNTHESIS EXAMPLE 3

Synthesis of Tetrapolymer

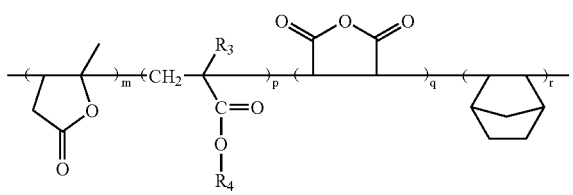

In the above formula, $R_3$ is methyl and $R_4$ is 2-methyladamantyl.

6 g 2-methyladamantylmethacrylate (MAdMA), 1.9 g maleic anhydride (MA), 1.2 g α-angelicalactone (AGL) and 0.63 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 72%.

The obtained tetrapolymer had a weight average molecular weight (Mw) of 12,600, and a polydispersity (Mw/Mn) of 1.9.

In the synthesis of the tetrapolymer, the mixing ratio of the monomers can be varied to adjust the solubility of the polymer. The various mixing ratios of the monomers, and the characteristics of the resultant six tetrapolymers are listed below in Table 2.

SYNTHESIS EXAMPLE 4

Synthesis of Terpolymer

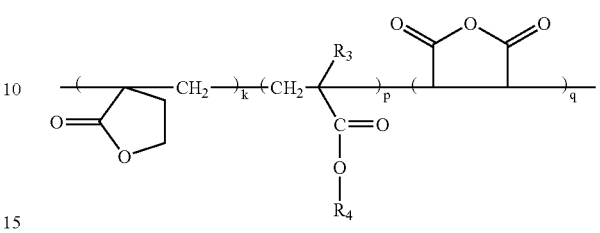

In the above formula, $R_3$ is methyl and $R_4$ is 2-methyladamantyl.

12.0 g 2-methyladamantylmethacrylate (MAdMA), 3.4 g maleic anhydride (MA), and 1.66 g α-methylenebutyrolactone (α-MBL) were dissolved in 17 g tetrahydrofuran (THF). 1.38 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the terpolymer having the formula above was obtained with a yield of 73%.

The obtained terpolymer had a weight average molecular weight (Mw) of 15,400, and a polydispersity (Mw/Mn) of 2.9.

SYNTHESIS EXAMPLE 5

Synthesis of Tetrapolymer

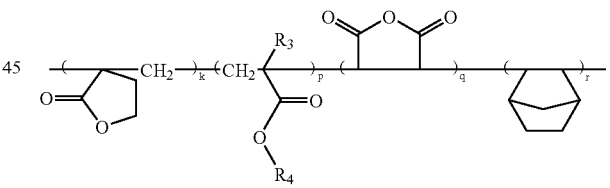

TABLE 2

| Mixing Ratio of Monomers (MAdMA:MA:Nb:AGL) | Concentration of Initiator (mol %) | Solvent-to-Monomer ratio (by weight) | Polymerization Time (hr) | Yield (%) | Mw | Mw/Mn |
|---|---|---|---|---|---|---|
| 4:3:2:1 | V601 0.05 | 1 | 24 | 74 | 8,300 | 2.6 |
| 4:3:1:2 | V601 0.05 | 1 | 24 | 62 | 7,700 | 2.1 |
| 4:3:2:2 | V601 0.05 | 1 | 24 | 65 | 6,700 | 2.2 |
| 4:2:2:2 | V601 0.05 | 1 | 20 | 59 | 6,700 | 2.0 |
| 4::1:2 | V601 0.05 | 1 | 20 | 31 | 6,800 | 1.7 |
| 4:1:1:3 | V601 0.05 | 1 | 20 | 62 | 5,600 | 1.6 |

Synthesis Example 5-1

($R_3$=methyl, $R_4$=2-methyl-adamantyl)

6 g 2-methyladamantylmethacrylate (MAdMA), 1.88 g maleic anhydride (MA), 0.63 g α-methylenebutyrolactone (α-MBL), and 1.21 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 88%.

The obtained tetrapolymer had a weight average molecular weight (Mw) of 15,800, and a polydispersity (Mw/Mn) of 3.3.

In the synthesis of the tetrapolymer, the mixing ratio of the monomers can be varied to adjust the solubility of the polymer. The various mixing ratios of the monomers, and the characteristics of the resultant three tetrapolymers are listed below in Table 3.

Synthesis Example 5-2

($R_3$=methyl, $R_4$=2-methyl-adamantyl)

6.4 g 2-ethyladamantylmethacrylate (EAdMA), 1.88 g maleic anhydride (MA), 0.63 g α-methylenebutyrolactone (α-MLB), and 1.21 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 78%.

The obtained tetrapolymer had a weight average molecular weight (Mw) of 11,600, and a polydispersity (Mw/Mn) of 3.0.

Synthesis Example 5-3

($R_3$=hydrogen, $R_4$=2-methyl-adamantyl)

6.2 g 2-methyladamantylacrylate (MAdA), 2.06 g maleic anhydride (MA), 0.69 g α-methylenebutyrolactone (α-MBL), and 1.32 g norbornene (Nb) were dissolved in 9.7 g tetrahydrofuran (THF). 0.74 g dimethyl 2,21-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 76%.

The obtained tetrapolymer had a weight average molecular weight (Mw) of 7,010, and a polydispersity (Mw/Mn) of 1.96.

SYNTHESIS EXAMPLE 6

Synthesis of Tetrapolymer

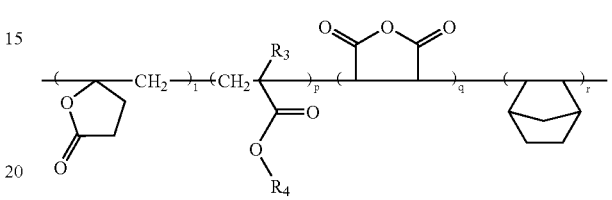

TABLE 3

| Mixing Ratio of Monomers (MAdMA:MA:α-MBL:Nb) | Concentration of Initiator (mol %) | Solvent-to-Monomer ratio (by weight) | Polymerization Time (hr) | Yield (%) | Mw | Mw/Mn |
| --- | --- | --- | --- | --- | --- | --- |
| 3:3:1:2 | V601 0.05 | 1 | 20 | 87 | 13,300 | 3.6 |
| 4:3:1:2 | V601 0.05 | 1 | 20 | 88 | 15,800 | 3.4 |
| 5:3:1:2 | V601 0.05 | 1 | 20 | 86 | 18,600 | 3.7 |

In the above formula, $R_3$ is methyl and $R_4$ is 2-methyl-adamantyl.

6.4 g 2-methyladamantylmethacrylate (MAdMA), 1.88 g maleic anhydride (MA), 0.63 g γ-methylenebutyrolactone (γ-MBL), and 1.21 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 82%.

The obtained tetrapolymer had a weight average molecular weight (Mw) of 14,300, and a polydispersity (Mw/Mn) of 2.8.

SYNTHESIS EXAMPLE 7

Synthesis of Monomer

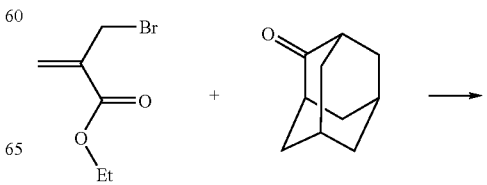

SYNTHESIS EXAMPLE 8

Synthesis of Terpolymer

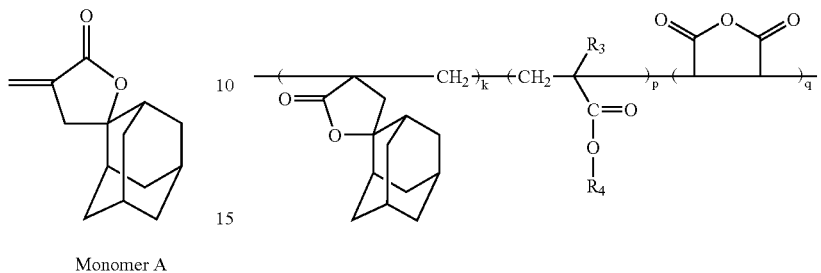

Monomer A

A solution of 30 g 2-bromomethylacrylic acid ethyl ester in 100 ml anhydrous THF was added dropwise with vigorous stirring under nitrogen to a mixture of 10.6 g zinc and 15.5 g adamantanone in 50 ml anhydrous THF. The reaction mixture was reacted at 60° C. for 10 hours. The reaction product was cooled down to room temperature, poured into 500 ml diluted hydrochloric acid solution, and extracted with 700 ml ether twice. The extracted solution was washed with 400 ml aqueous sodium hydrogencarbonate ($NaHCO_3$) and with 400 ml water, and then dried over anhydrous sodium sulfate ($Na_2SO_4$). The dried product was evaporated with ether under reduced pressure. The residue was recrystallized from methylene dichloride and hexane, so that white solid monomer A was obtained with a yield of 62%.

In the above formula, $R_3$ is methyl and $R_4$ is 2-methyladamantyl.

7.03 g 2-methyladamantylmethacrylate (MAdMA), 1.96 g maleic anhydride (MA), and 2.18 g Monomer A synthesized in Synthesis Example 7 were dissolved in 11.2 g tetrahydrofuran (THF). 0.69 g dimethyl 2,2'-azobisisobutyrate (V601) was added to the solution, degassed and polymerized at 70° C. for 4 hours.

After the reaction was completed, the obtained reaction product was precipitated with excess isopropyl alcohol twice, filtered, and dried in a vacuum oven for 24 hours, so that the tetrapolymer having the formula above was obtained with a yield of 86%.

The obtained terpolymer had a weight average molecular weight (Mw) of 8,200, and a polydispersity (Mw/Mn) of 2.0.

In the synthesis of the terpolymer, the mixing ratio of the monomers can be varied. The various mixing ratios of the monomers, and the characteristics of the resultant three terpolymers are listed below in Table 4.

TABLE 4

| Mixing Ratio of Monomers (MAdMA:MA:Monomer A) | Concentration of Initiator (mol %) | Solvent-to-Monomer ratio (by weight) | Polymerization Time (hr) | Yield (%) | Mw | Mw/Mn |
|---|---|---|---|---|---|---|
| 3:6:1 | V601 0.05 | 1 | 4 | 62 | 5,700 | 2.1 |
| 3:4:1 | V601 0.05 | 1 | 4 | 72 | 7,000 | 2.0 |
| 3:2:1 | V601 0.05 | 1 | 4 | 86 | 8,200 | 2.0 |

SYNTHESIS EXAMPLE 9

Synthesis of Tetrapolymer

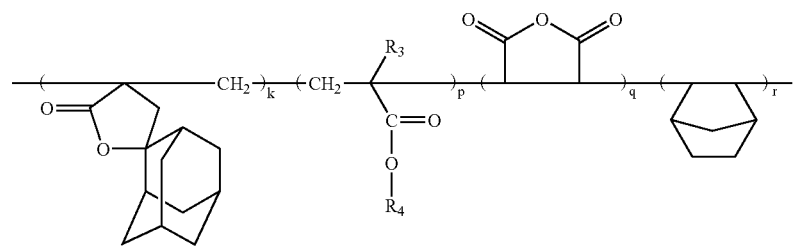

In the above formula, $R_3$ is methyl and $R_4$ is 2-methyladamantyl.

9.7 g 2-methyladamantylmethacrylate (MAdMA), 4.06 g maleic anhydride (MA), 3 g Monomer A synthesized in Synthesis Example 7, and 2.6 g norbornene (Nb) were dissolved in 19.6 g tetrahydrofuran (THF). 1.6 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 86%.

The obtained tetrapolymer had a weight average molecular weight (Mw) of 5,500, and a polydispersity (Mw/Mn) of 2.4.

EXAMPLE 1

Preparation of Resist Composition 1.0 g each of the polymers obtained in Synthesis Examples 1-1 through 1-3, Synthesis Example 2, and Synthesis Example 3, 0.01 g triphenylsulfonium trifluoromethanesulfonate (triflate) as a photoacid generator (PAG), and 3.2 mg triisodecylamine as an organic base, were completely dissolved in a mixed solution of 4.0 g propylene glycol monomethyl ether acetate (PGMEA) and 4.0 g cyclohexanone, and filtered through a membrane filter of 0.2 μm, so that resist compositions were obtained. Each of the resist compositions was coated on a silicon (Si) wafer treated with organic anti-reflective coating (ARC) to a thickness of about 0.35 μm.

The wafers coated with the respective resist compositions were soft baked at 130° C. for 90 seconds, exposed using an ArF eximer laser stepper (NA=0.6), and subjected to a post-exposure bake (PEB) at 120° C. for 60 seconds.

The resultant wafers were developed using 2.38% by weight tetramethylammonium hydroxide solution for about 60 seconds. As a result, 0.17-0.23 μm line and space patterns of photoresist were formed with an exposure dosage of 10 to 30 mJ/cm².

EXAMPLE 2

Preparation of Resist Composition 1.0 g each of the polymers obtained in Synthesis Example 4, Synthesis Examples 5-1 through 5-3, and Synthesis Example 6, 0.01 g triflate as a PAG, and 3.2 mg triisodecylamine as an organic base, were completely dissolved in a mixed solution of 4.0 g PGMEA and 4.0 g cyclohexanone, and filtered through a membrane filter of 0.2 μm, so that resist compositions were obtained. Each of the resist compositions was coated on a silicon (Si) wafer treated with organic anti-reflective coating (ARC) to a thickness of about 0.35 μm.

The wafers coated with the respective resist compositions were soft baked at 130° C. for 90 seconds, exposed using an ArF eximer laser stepper (NA=0.6), and subjected to a post-exposure bake (PEB) at 120° C. for 60 seconds.

The resultant wafers were developed using 2.38% by weight tetramethylammonium hydroxide solution for about 60 seconds. As a result, 0.17-0.23μ line and space pattern of photoresist were formed with an exposure dosage of 10 to 30 mJ/cm².

The photosensitive polymer, which constitutes the photoresist composition according to the present invention, includes a cyclic lactone in its backbone. Thus, the manufacturing cost is very low, and the problems of the conventional polymers used in the production of ArF resists can be largely overcome. The resist composition prepared from the photosensitive polymer exhibits excellent resistance to dry etching, superior adhesiveness to underlying material layers, and improved transmittance. The cyclic lactone included in the polymer backbone is highly hydrophilic. When forming space and line patterns from the resist layer deposited with the resist composition according to the present invention, line edge roughness characteristic is improved. The dissolution contrast characteristic, which appears after developing, sharply increases, thereby enlarging the depth of focus (DOF) margin.

The photosensitive polymer of the resist composition according to the present invention has a desirable glass transition temperature of 140 to 180° C. As for the resist layer which contains the photosensitive polymer according to the present invention, the free volume of the resist layer can be decreased due to a sufficient annealing effect during a baking process. As a result, the resist layer becomes more resistant to the ambient environment during post-exposure delay (PED). Thus, use of the resist composition according to the present invention in a photolithography process exhibits superior lithography characteristics, and is therefore useful in the manufacture of future generation semiconductor devices.

While this invention has been particularly shown and described with reference to preferred embodiments thereof, it will be understood by those skilled in the art that various changes in form and details may be made thereto without departing from the spirit and scope of the invention as defined by the appended claims.

It is noted that priority has been claimed to Korean Patent Application No. 00-39562, filed 11 Jul. 2000, and Korean Patent Application No. 00-75485, filed 12 Dec. 2000. Both of these Korean applications are incorporated herein in their entirety.

What is claimed is:

1. A resist composition comprising:
   a photosensitive polymer polymerized with (a) at least one of the monomers having the respective formulae:

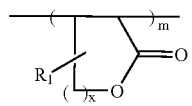 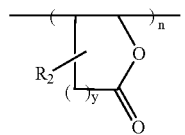

where R1 and R2 are independently a hydrogen atom, alkyl, hydroxyalkyl, alkyloxy, carbonyl or ester, and x and y are independently integers from 2 to 6, and (b) a (meth)acrylate monomer; and
   a photoacid generator (PAG);
   wherein the formula of the photosensitive polymer is one selected from the formulae:

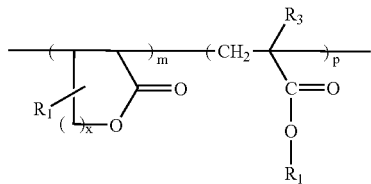

where R3 is a hydrogen atom or methyl, R4 is an acid-liable group, m/(m+p) is in the range of 0.01-0.5,

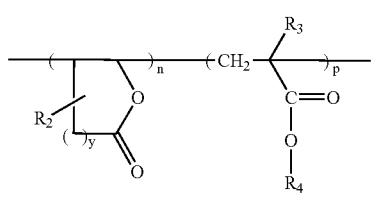

where R3 is a hydrogen atom or methyl, R4 is an acid-liable group, n/(n+p) is in the range of 0.01-0.5, and

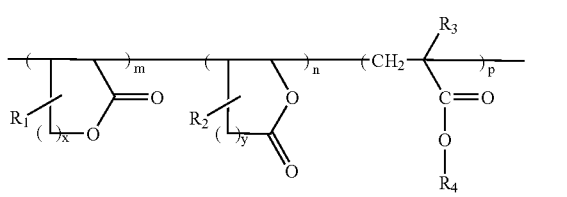

where R3 is a hydrogen atom or methyl, R4 is an acid-liable group, (m+n)/(m+n+p) is in the range of 0.01-0.5.

2. The resist composition of claim 1, wherein R4 is t-butyl, tetrahydropyranyl, or substituted or unsubstituted alicyclic hydrocarbon having from 6 to 20 carbon atoms.

3. The resist composition of claim 2, wherein R4 is 2-methyl-2-norbornyl, 2-ethyl-2-norbornyl, 2-methyl-2-isobornyl, 2-ethyl-2-isobornyl, 8-methyl-8-tricyclo[5.2.1.0²,⁶]decanyl, 8-ethyl-8-tricyclo[5.2.1.0²,⁶]decanyl, 2-methyl-2-adamantyl, 2-ethyl-2-adamantyl, 1-adamantyl-1-methylethyl, 2-methyl-2-fenchyl or 2-ethyl-2-fenchyl.

4. A resist composition comprising:
a photosensitive polymer polymerized with (a) at least one of the monomers having the respective formulae:

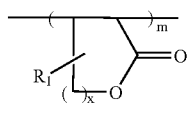 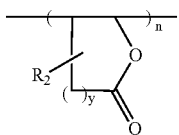

where R1 and R2 are independently a hydrogen atom, alkyl, hydroxyalkyl, alkyloxy, carbonyl or ester, and x and y are independently integers from 2 to 6, and (b) a norbornene monomer; and
a photoacid generator (PAG);
wherein the formula of the photosensitive polymer is one selected from the formulae:

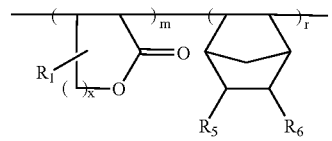

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; m/(m+r) is in the range of 0.01-0.5,

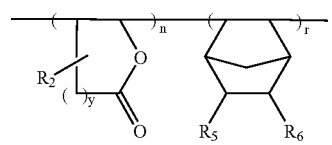

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; n/(n+r) is in the range of 0.01-0.5, and

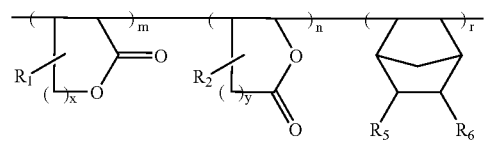

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; (m+n)/(m+n+r) is in the range of 0.01-0.5.

5. A resist composition comprising:
a photosensitive polymer polymerized with (a) at least one of the monomers having the respective formulae:

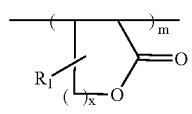 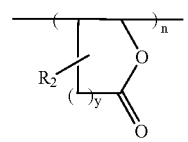

where R1 and R2 are independently a hydrogen atom, alkyl, hydroxyalkyl, alkyloxy, carbonyl or ester, and x and y are independently integers from 2 to 6, (b) a (meth)acrylate monomer, and (c) a norbornene monomer; and
a photoacid generator (PAG);
wherein the formula of the photosensitive polymer is selected from the formulae:

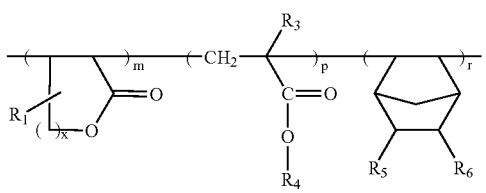

where R3 is a hydrogen atom or methyl; R4 is an acid-liable group; R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; m/(m+p+r) is in the range of 0.01-0.5; p/(m+p+r) is in the range of 0.1-0.6; and r(m+p+r) is in the range of 0.1-0.6,

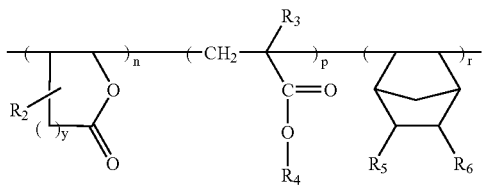

where R3 is a hydrogen atom or methyl; R4 is an acid-liable group; R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; n/(n+p+r) is in the range of 0.01-0.5; p/(n+p+r) is in the range of 0.1-0.6; and r(n+p+r) is in the range of 0.1-0.6, and

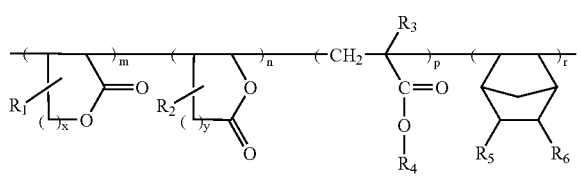

where R3 is a hydrogen atom or methyl; R4 is an acid-liable group; R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; p/(m+n+p+r) is in the range of 0.1-06; and q(m+n+p+r) is in the range of 0.1-0.6.

6. The resist composition of claim 5, wherein R4 is t-butyl, tetrahydropyranyl, or substituted or unsubstituted alicyclic hydrocarbon having from 6 to 20 carbon atoms.

7. The resist composition of claim 6, wherein R4 is 2-methyl-2-norbornyl, 2-ethyl-2-norbornyl, 2-methyl-2-isobornyl, 2-ethyl-2-isobornyl, 8-methyl-8-tricyclo[5.2.1.02,6]decanyl, 8-ethyl-8-tricyclo[5.2.1.02,6]decanyl, 2-methyl-2-adamantyl, 2-ethyl-2-adamantyl, 1-adamantyl-1-methylethyl, 2-methyl-2-fenchyl or 2-ethyl-2-fenchyl.

8. A resist composition comprising:
a photosensitive polymer polymerized with (a) at least one of the monomers having the respective formulae:

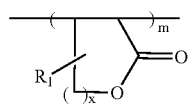 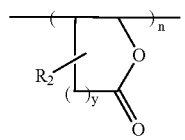

where R1 and R2 are independently a hydrogen atom, alkyl, hydroxyalkyl, alkyloxy, carbonyl or ester, and x and y are independently integers from 2 to 6, (b) a maleic anhydride monomer, and (c) a norbornene monomer; and
a photoacid generator (PAG);
wherein the formula of the photosensitive polymer is selected from the formulae:

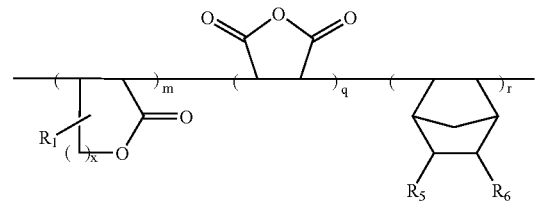

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; m/(m+q+r) is in the range of 0.01-0.5, q/(m+q+r) is in the range of 0.1-0.6, and r(m+q+r) is in the range of 0.1-0.6,

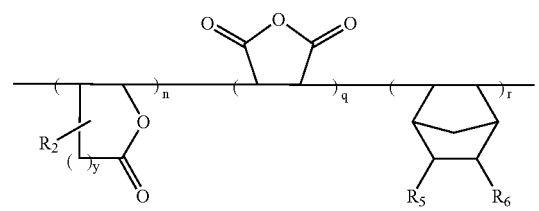

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; n/(n+q+r) is in the range of 0.01-0.5, q/(n+q+r) is in the range of 0.1-0.6, and r(n+q+r) is in the range of 0.1-0.6, and

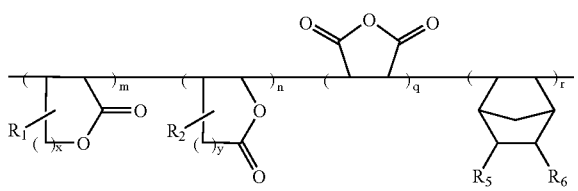

where R5 and R6 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $(m+n)/(m+n+q+r)$ is in the range of 0.01-0.5, $q/(m+n+q+r)$ is in the range of 0.1-06, and $r(m+n+q+r)$ is in the range of 0.1-0.6.

* * * * *